(12) United States Patent
Wang et al.

(10) Patent No.: US 12,422,457 B2
(45) Date of Patent: Sep. 23, 2025

(54) PROBE CARD

(71) Applicant: Hermes Testing Solutions Inc., Hsinchu (TW)

(72) Inventors: Tzu-Chien Wang, Hsinchu (TW); Wen-Yuan Hsu, Hsinchu (TW); Ming-Hsien Chen, Hsinchu (TW); Jia-Lin Lu, Hsinchu (TW)

(73) Assignee: HERMES TESTING SOLUTIONS INC., Hsinchu (TW)

( * ) Notice: Subject to any disclaimer, the term of this patent is extended or adjusted under 35 U.S.C. 154(b) by 119 days.

(21) Appl. No.: 18/084,256

(22) Filed: Dec. 19, 2022

(65) Prior Publication Data
US 2023/0194571 A1 Jun. 22, 2023

(30) Foreign Application Priority Data
Dec. 20, 2021 (TW) .................. 110147649

(51) Int. Cl.
*G01R 1/073* (2006.01)
*G01R 1/067* (2006.01)

(52) U.S. Cl.
CPC ..... *G01R 1/07364* (2013.01); *G01R 1/06716* (2013.01); *G01R 1/07342* (2013.01)

(58) Field of Classification Search
None
See application file for complete search history.

(56) References Cited

U.S. PATENT DOCUMENTS

| | | | |
|---|---|---|---|
| 2002/0145437 A1* | 10/2002 | Sporck .............. | G01R 1/07342 324/754.07 |
| 2007/0007977 A1* | 1/2007 | Eldridge ............ | G01R 31/2889 324/762.03 |
| 2017/0110815 A1* | 4/2017 | Xiao .................. | H01R 12/7058 |
| 2017/0315149 A1* | 11/2017 | Chen .................. | G01R 1/07307 |

\* cited by examiner

*Primary Examiner* — Nasima Monsur
(74) *Attorney, Agent, or Firm* — Muncy, Geissler, Olds & Lowe, P.C.

(57) ABSTRACT

The present invention provides a probe card. A module cap, on the probe card substrate, is designed to have a chute and the probe module can be installed on or uninstalled from the module cap via the chute. That simplifies the operations of assembling and disassembling the probe card and avoids positioning error.

6 Claims, 9 Drawing Sheets

PRIOR ART

【Fig.1A】

PRIOR ART

PROBE CARD

BACKGROUND OF THE INVENTION

1. Field of the Invention

The present invention relates to a probe card and especially that is easy to be assembled and disassembled.

2. Description of the Prior Art

Figure 1A:
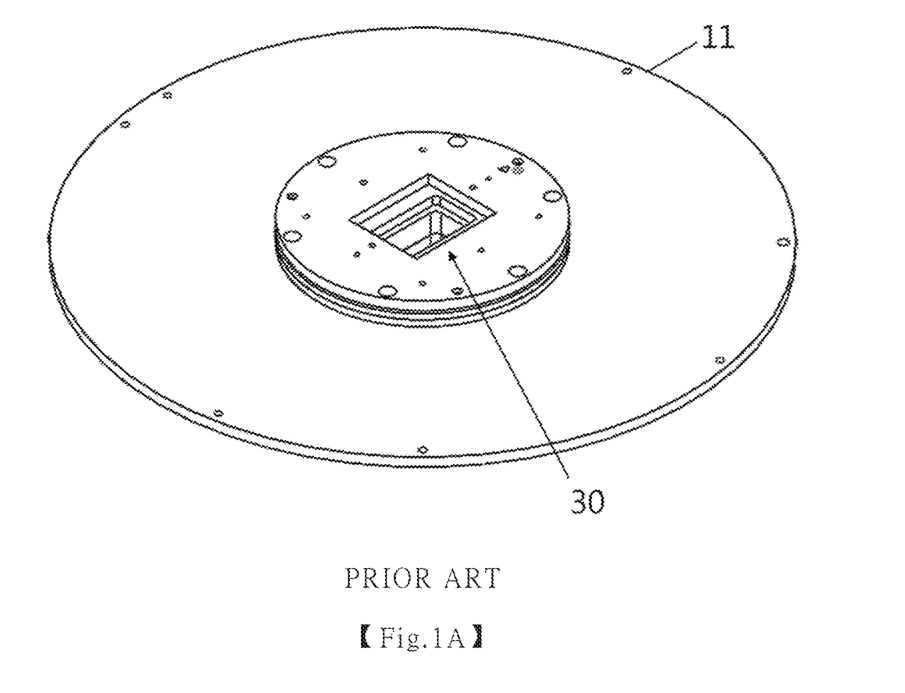
FIGS. 1A and 1B are respectively a top view and a bottom view of a conventional probe card.
Figure 1B:
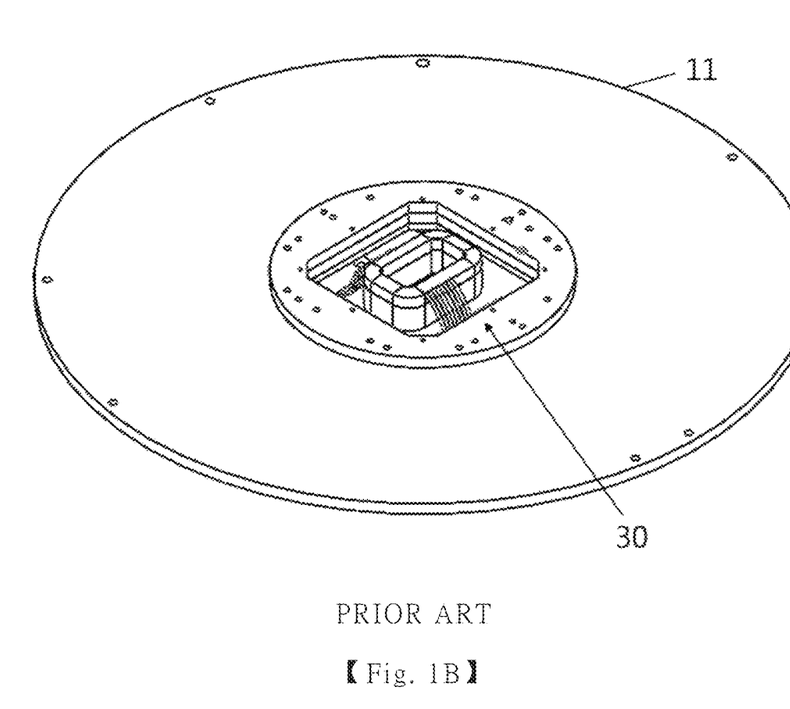

A probe card is used to carry a probe or probes and the probe(s) can contact electrodes of the circuit on wafer (or die electrode). In probing, the probe card is driven to scan inspecting areas on the wafer to check the electrical conduction quality. FIGS. 1A and 1B show a conventional probe card. A probe module is fixed on a substrate and the probe(s) of the probe module will pass a through hole of the substrate to check conduction quality for circuits of the semiconductor on the wafer.

In probing, the requirements of the positioning and the leveling are very strict, and that depends on the precise operation of assembling.

SUMMARY OF THE INVENTION

The present invention proposes a structure for the probe card to simply the assembling and disassembling and to reduce the manipulation deviation.

A probe card comprises a card substrate with a through hole, a cap base on the card substrate and a module cap. The module cap rotatably links with the cap base. The module cap comprises one groove at least and a probe module can be installed on and uninstalled from the module cap via the groove(s). In probing, the module cap will be closed and locked, and the head of the probe module can pass the through hole of the card substrate to inspect circuit of the chip.

DESCRIPTION OF THE PREFERRED EMBODIMENTS

The following embodiments and the diagrams are intended to illustrate the spirit of the present invention to person having ordinary skilled in the art to be clearly understand the technology of the present invention, but are not intended to limit its scope, as defined by the claims. It is emphasized that the diagrams are for illustration only, and do not represent the actual size or quantity of components, and some details may not be fully drawn for the sake of simplicity of the diagrams.

Figure 2A:
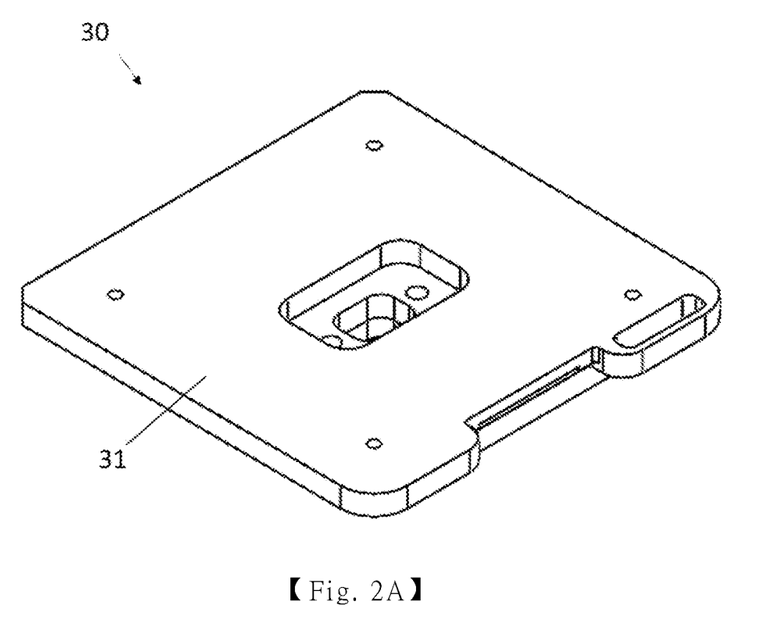
FIGS. 2A and 2B are respectively a top view and a bottom view of a probe module, one embodiment of the present invention.
Figure 2B:
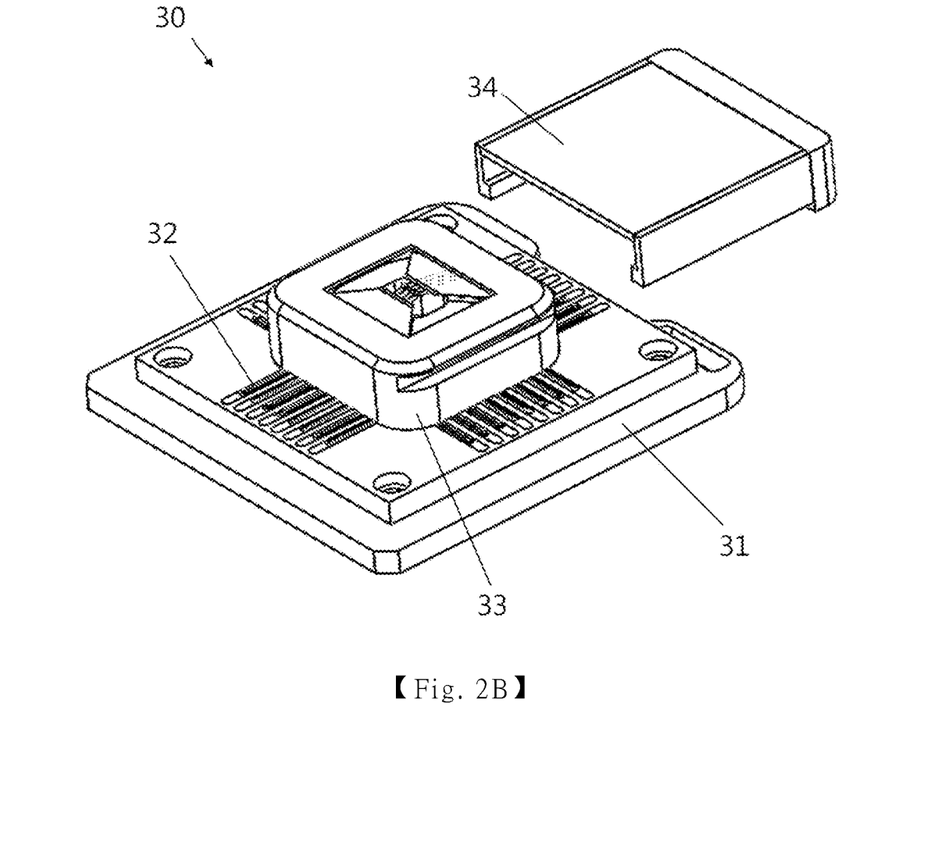

FIGS. 2A and 2B are respectively a top view and a bottom view of a probe module 30 according to the present invention. The probe module 30 can be assembled with or disassembled from a probe card. The probe module 30 comprises a module substrate 31, a head 33 and a cover 34. The head 33 is disposed on the module substrate 31 and electrically connected via a conductive connector 32. The conductive connector 32 is elastic, such as a spring pin, an elastic pin or a flexible pin. The head 33 comprises at least one probe pin to inspect an inspecting area(s) on a wafer. In one embodiment, the head 33 is designed to have a chute and the cover 34 can be slide into the chute. In probing, the cover 34 will be removed to expose the head 33 for inspecting, and in preserving, the cover 34 can be used to cover the head 33 to avoid being suffered from the moisture and dust.

The module substrate 31 can be equipped with one level calibrating component at least. In one embodiment, three level calibrating components are used and disposed on the module substrate 31 beside its three edges respectively. The level calibrating component is used to assure the probe module level in any installation and uninstallation.

Figure 3A:
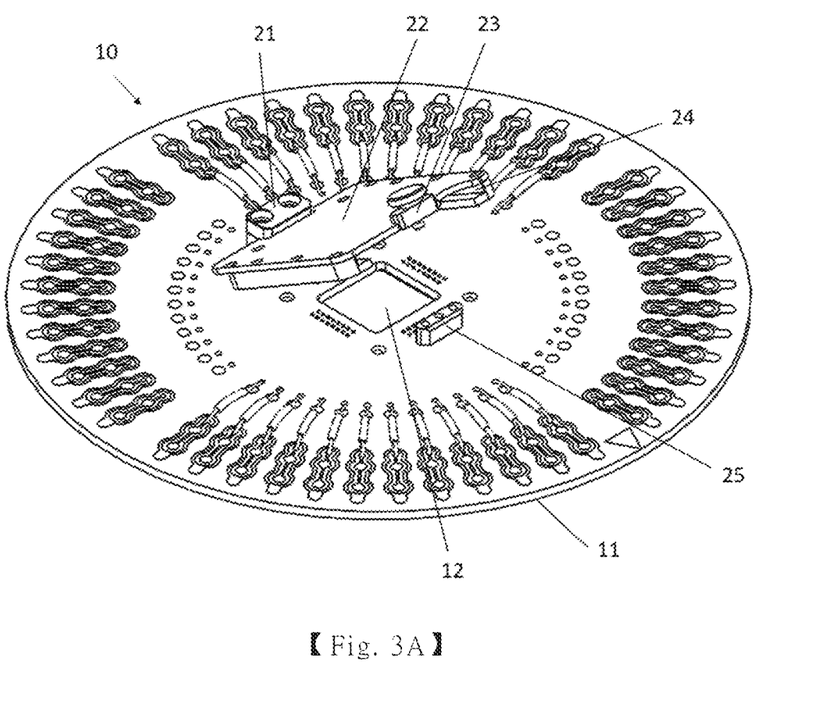
FIG. 3A~3E show the process of assembling the probe card, one embodiment of the present invention.

FIG. 3A~3E show the process of assembling the probe module. FIG. 3A shows uninstalled status. The probe card 10 comprises a card substrate 11 with a through hole 12, a module cap 22a connected rotatably with a cap base 21 on the card substrate 11. In FIG. 3A, the module cap 22 is opened with an angle and the angle is rotatable and the angle rang is from 0 to 90 degree.

The cap base 21 and the module cap 22 could be metal. The cap base cap 21 is fixed on the card substrate 11 by screwing or bolt. The module cap 22 can be closed and locked on the card substrate 11 by magnetic extraction, buckle fastener or screw bolt, such as a latch structure 25 in the shown embodiment and the latch structure 25 is at the opposite edge of the cap base 21. In one embodiment, the module cap 22 is substantially planar. In addition, the probe card 10 includes a pair of lateral substantially-L-shaped arms 222 that are respectively attached to one pair of opposite lateral edges 302 of the module cap 22. In this way, a pair of opposite grooves 24 are formed between the module cap 22 and the pair of lateral L-shaped arms 222.

Figure 3B:
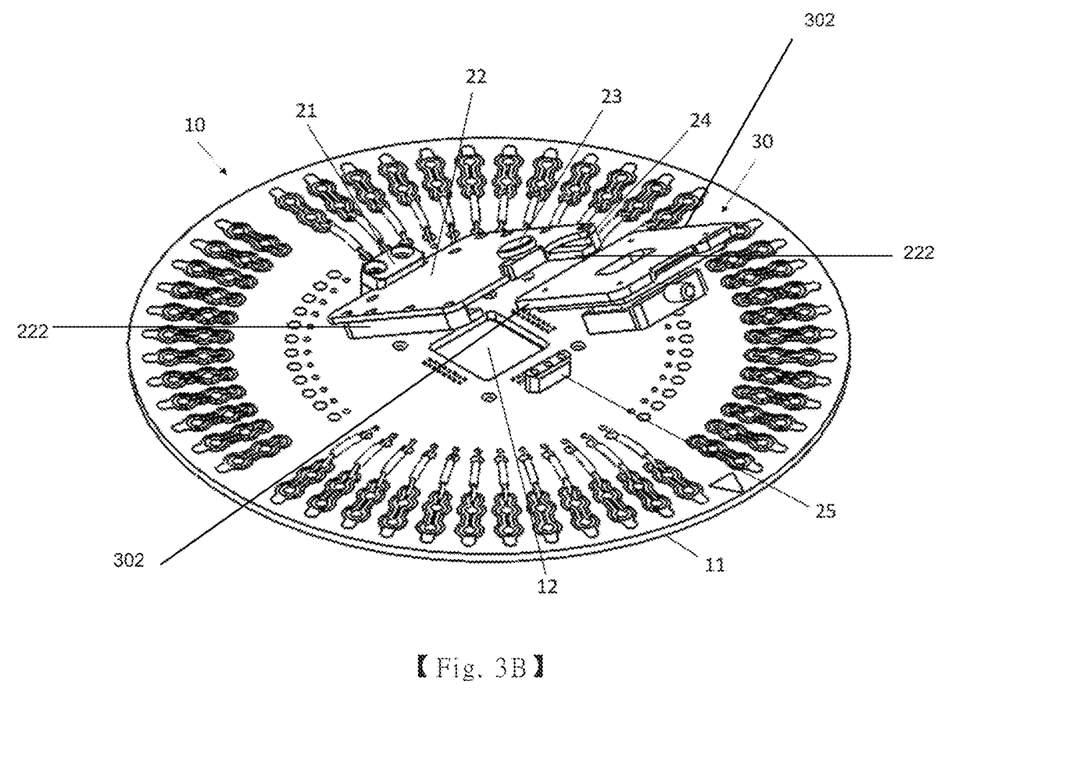
Figure 3C:
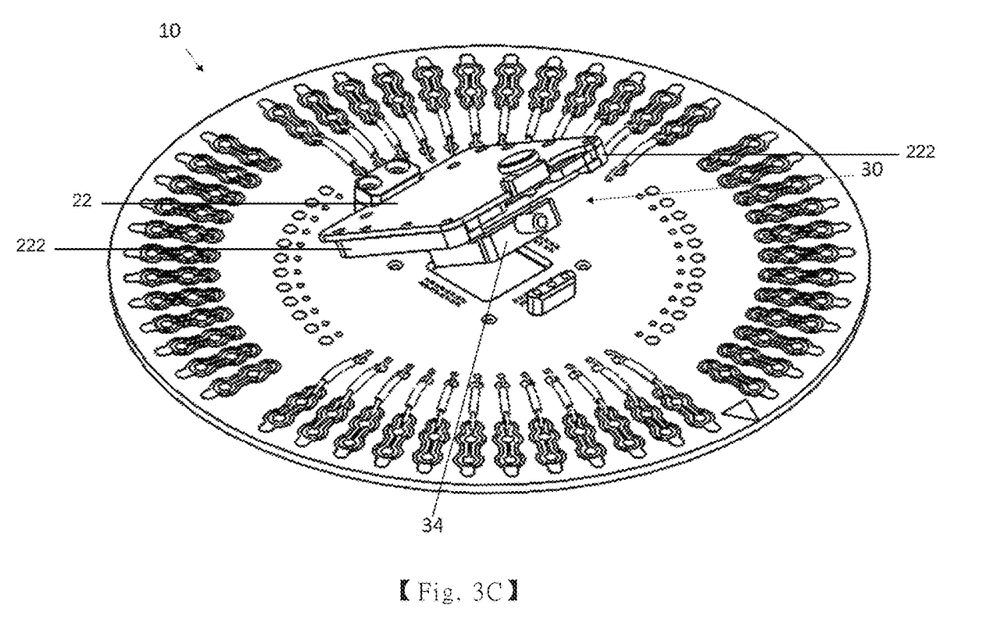
Figure 3D:
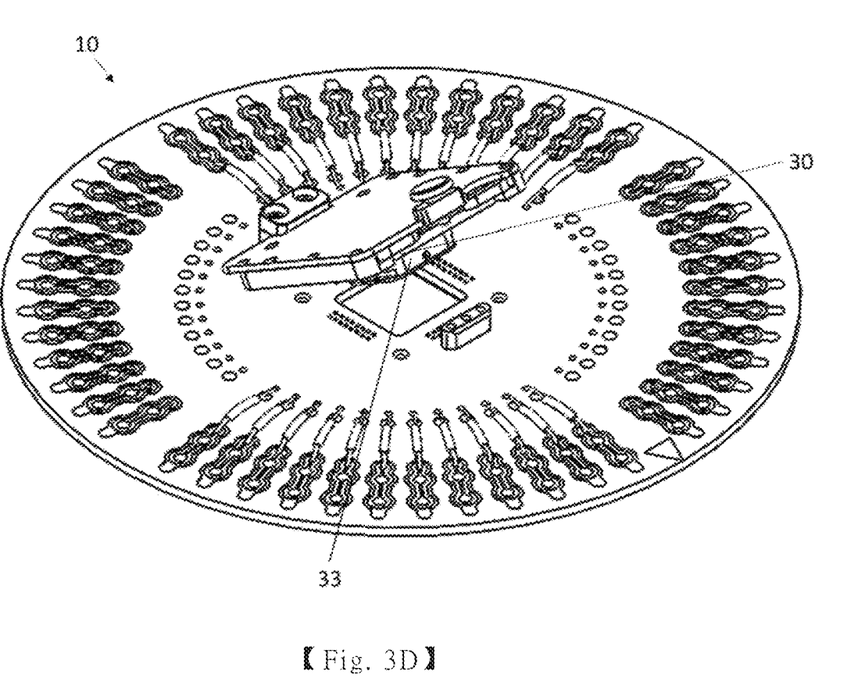

FIGS. 3B, 3C and 3D show the assembling process according to one embodiment. FIG. 3B shows the internal side of the module cap 22 along with the pair of grooves 24 that are capable of receiving or ejecting the pair of opposite edges 302 in a slidable manner. In FIG. 3C, with the aid of the pair of opposite lateral edges 302 of the probe module 30 being guiding members that can slide into or out of the groove 24, the probe module 30 slides into the groove 24 to be installed on the module cap 22, or the probe module 30 slides out from the groove 24 in uninstalling from the module cap 22. It is noted that the pair of opposite edges 302 has been received by the pair of grooves 24 in FIG. 3C, such that the pair of opposite edges 302 are invisible in FIG. 3C as well. In one embodiment, a buckle structure (not shown) is disposed on the module substrate 31, a joint structure (not shown) is disposed on the groove 24 and the buckle can combine with the joint structure to position the probe module 30. After installing the probe module 30, the cover 34 can be removed out to expose the head 33. FIG. 3D shows the probe module 30 has been installed on the module cap 10, the cover 34 is removed and the probe module 30 is faced to the through hole 12.

In the shown embodiment, the module substrate 31 is rectangle and the groove 24 is made to be able to fasten tightly the module substrate 31. Therefore, the groove 24 simplifies the operations of assembling, disassembling and positioning the probe module 30 for the operator and reduce the positioning error.

Figure 3E:
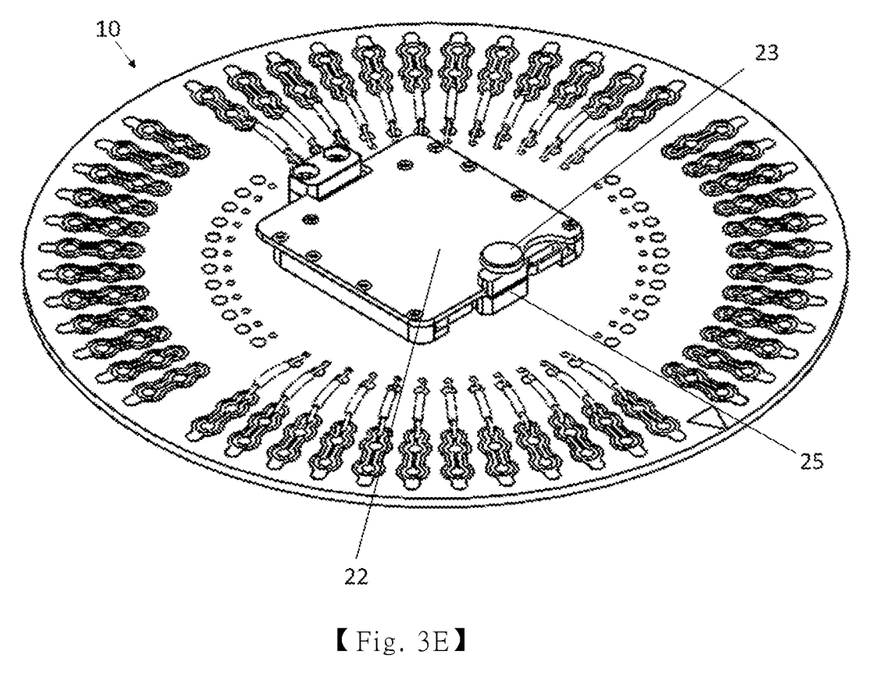

FIG. 3E shows the installation status. The module cap 22 is covered on the through hole 12 and the head 33 passes the through hole 12 to protrude from the card substrate 11. Therefore, the probe pin(s) of the head 33 is able to contact and electrically connect the inspecting area(s) on a wafer under the probe card 10. A lock structure 23 is disposed on the module cap 22 and the lock structure can combine with a latch structure 25 on the card substrate 11. After assembling the probe card 10, a probing process for electrical quality inspection can start.

After probing, the reverse process of assembling the probe card can disassemble the probe module 30 from the probe card 10. The cover 34 can be re-covered to preserve the probe module 30.

What is claimed is:

1. A probe card, comprising:
    a probe module, where the probe module comprises a head, a module substrate configured to carry the head, and a conductive connector configured to electrically connect the head and the module substrate;
    a card substrate with a through hole;
    a cap base on the card substrate;
    a module cap connected rotatably with the cap base to cover or uncover the through hole by rotating the module cap, wherein the module cap is substantially planar; and
    a pair of lateral L-shaped arms respectively attached to a pair of opposite lateral edges of the module cap, wherein a pair of opposite lateral grooves are formed between the module cap and the pair of lateral L-shaped arms and are configured to slidably accept a pair of lateral edges of the probe module for slidably installing the probe module on the module cap to face the through hole or to slidably pull the pair of lateral edges of the probe module out from the module cap for slidably uninstalling the probe module from the module cap, the module cap carries and fixes the probe module via the pair of opposite lateral grooves, and the head of the probe module passes the thorough hole to protrude from the card substrate when the module cap is closed, and the head of the probe module is pulled back when the module cap is opened.

2. A probe card of claim 1, wherein the conductive connector is an elastic connector.

3. A probe card of claim 2, wherein the elastic connector comprises at least one spring pin, one elastic pin or one flexible pin.

4. A probe card of claim 1, wherein the probe module comprises a head cover configured to cover the head for preserving the probe module to be suffered from the moisture or dust when being assembled.

5. A probe card of claim 1, wherein the probe module comprises a buckle structure, the module cap comprises a joint at the groove, and the buckle structure can combine with the joint to lock the probe module to assure the positioning.

6. A probe card of claim 1, wherein the module cap comprises a lock component, the card substrate comprises a latch component, and the lock component can combine tightly with the latch component when the module cap is closed.

* * * * *